United States Patent
Hsu

(10) Patent No.: US 7,866,985 B2
(45) Date of Patent: Jan. 11, 2011

(54) CPU SOCKET ASSEMBLY WITH PACKAGE RETENTION MECHANISM

(75) Inventor: Shuo-Hsiu Hsu, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 133 days.

(21) Appl. No.: 12/321,712

(22) Filed: Jan. 22, 2009

(65) Prior Publication Data

US 2009/0186510 A1 Jul. 23, 2009

(30) Foreign Application Priority Data

Jan. 22, 2008 (CN) .................... 2008 2 0031419

(51) Int. Cl.
*H01R 13/44* (2006.01)

(52) U.S. Cl. .................... 439/41; 439/135; 439/940

(58) Field of Classification Search .................... 439/41, 439/135, 259, 331, 342, 940
See application file for complete search history.

(56) References Cited

U.S. PATENT DOCUMENTS

| 3,771,109 | A | * | 11/1973 | Bruckner et al. ............ 439/331 |
| 5,329,227 | A | * | 7/1994 | Sinclair .................... 324/158.1 |
| 7,140,890 | B1 | * | 11/2006 | Ju ............................. 439/135 |
| 7,503,781 | B2 | * | 3/2009 | Chang ........................ 439/135 |
| 2009/0061652 | A1 | * | 3/2009 | Fan ............................. 439/41 |
| 2009/0186510 | A1 | * | 7/2009 | Hsu ............................ 439/342 |

* cited by examiner

*Primary Examiner*—James Harvey
(74) *Attorney, Agent, or Firm*—Andrew C. Cheng; Wei Te Chung; Ming Chieh Chang

(57) ABSTRACT

A CPU socket assembly includes a CPU socket and a pick up cap mounted to the CPU socket. The CPU socket has an insulative housing with a receiving space, a number of electrical contacts secured to the insulative housing with contact portions disposed in the receiving space; and a retention piece attached to the insulative housing. The retention piece has a pressing section covering part of the receiving space to retaining a package in the CPU socket.

13 Claims, 10 Drawing Sheets

CPU SOCKET ASSEMBLY WITH PACKAGE RETENTION MECHANISM

BACKGROUND OF THE INVENTION

1. Field of the Invention

The present invention relates to a CPU socket, and more particularly to a socket having improved CPU retention mechanism.

2. Description of Related Art

CPU sockets are provided to establish electrical connection between a CPU and a printed circuit board, and include an insulative housing and a number of electrical contacts secured on the insulative housing. The insulative housing has a base and a plurality of peripheral walls extending upwardly from the base. The base defines a number of through holes for receiving the electrical contacts. Generally, before soldering to the printed circuit board, the CPU sockets are put on the printed circuit board by a vacuum pick up device. The peripheral walls define a receiving space for accommodating the CPU package; therefore, the CPU socket cannot be directly sucked by the vacuum pick up device. Generally, it is provided with a pick up cap mounted to the CPU socket for being sucked by the vacuum pick up device.

One conventional CPU socket is shown in FIG. 9 and FIG. 10 and includes a retention frame 2, a number of housings 3 mounted to the retention frame 2, a number of electrical contacts (not shown) secured on the insulative housing 3, and positioning plates 4 located on corners of the retention frame 2. A pick up cap 5 is engaged with the retention frame 2 for transmitting the CPU socket. During assembly, the CPU socket with the pick up cap 5 are sucked by a vacuum pick up device (not shown) and put on the printed circuit board. The pick up cap 5 is detached from the retention frame 2 before the CPU socket soldering to the printed circuit board. However, when a CPU package (not shown) is attached to this CPU socket after soldering, the CPU package can not be well positioned on the socket. Moreover, the housing 3 also has distortion for the heat generated by the soldering, which will affect the electrical connection between the CPU package and the printed circuit board.

Hence, it is desired to provide an improved CPU socket to overcome the problems mentioned above.

BRIEF SUMMARY OF THE INVENTION

An object of the present invention is to provide a CPU socket assembly provided with a retention piece for retaining a package therein.

A CPU socket assembly comprises a CPU socket and a pick up cap mounted to the CPU socket. The CPU socket includes an insulative housing having a receiving space, a plurality of electrical contacts secured to the insulative housing with contact portions disposed in the receiving space; and a retention piece attached to the insulative housing. The retention piece has a pressing section covering part of the receiving space.

Other advantages and novel features of the present invention will become more apparent from the following detailed description when taken in conjunction with the accompanying drawings, in which:

DETAILED DESCRIPTION OF THE PREFERRED EMBODYMENT

Figure 1:
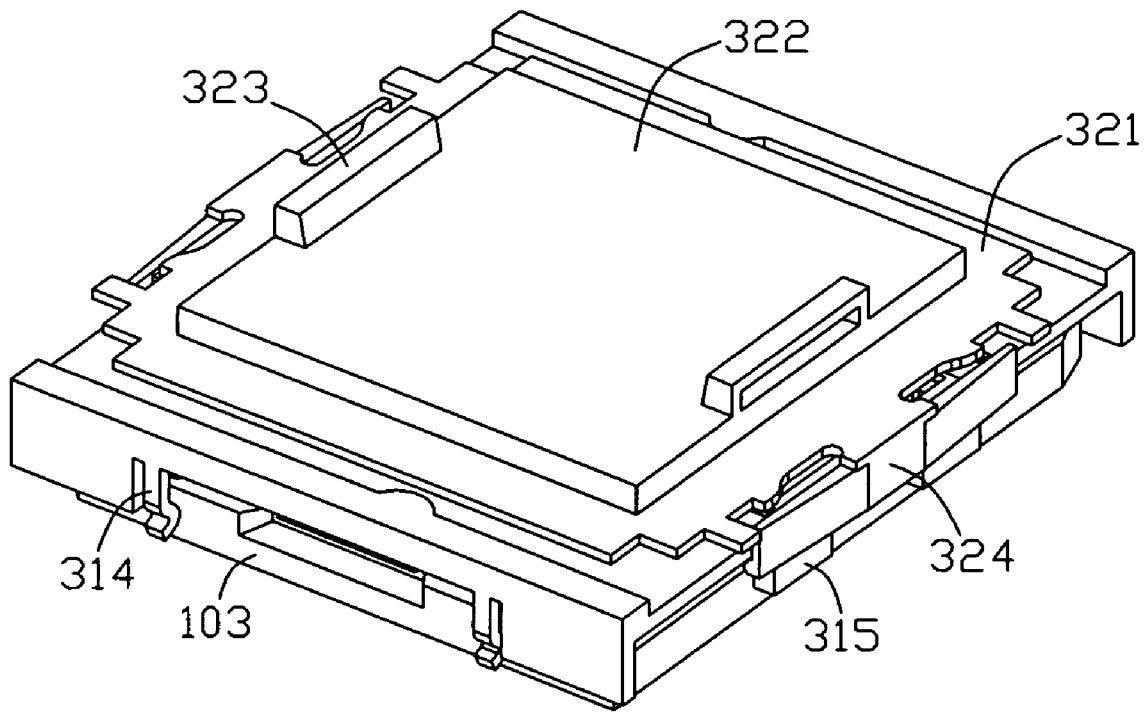
FIG. 1 is an assembly view of a CPU socket assembly in accordance with a preferred embodiment of the present invention.

Hereinafter, a preferred embodiment of the invention will be described in detail with reference to the attached drawings.

Referring to FIGS. 1 to 5, a CPU socket assembly 100 for carrying a CPU package electrically connected with a printed circuit board (not shown), comprises a CPU socket (not labeled) and a pick up cap device 30 mounted thereon. The CPU socket includes an insulative housing 10 and a plurality of electrical contacts (not shown) secured thereon. The pick up device 30 is a two-piece structure and includes a retention piece 31 and a pick up cap 32 sucked by a vacuum pick up equipment (not shown).

The insulatve housing 10 is made of plastic material and comprises a base 11 and a plurality of sidewalls 12 extending upwardly from the base 11. The side walls 12 define a receiving space 13 for the package 200. The base 11 has a plurality of passages (not shown) extending therethrough for receiving the contacts therein.

Figure 2:
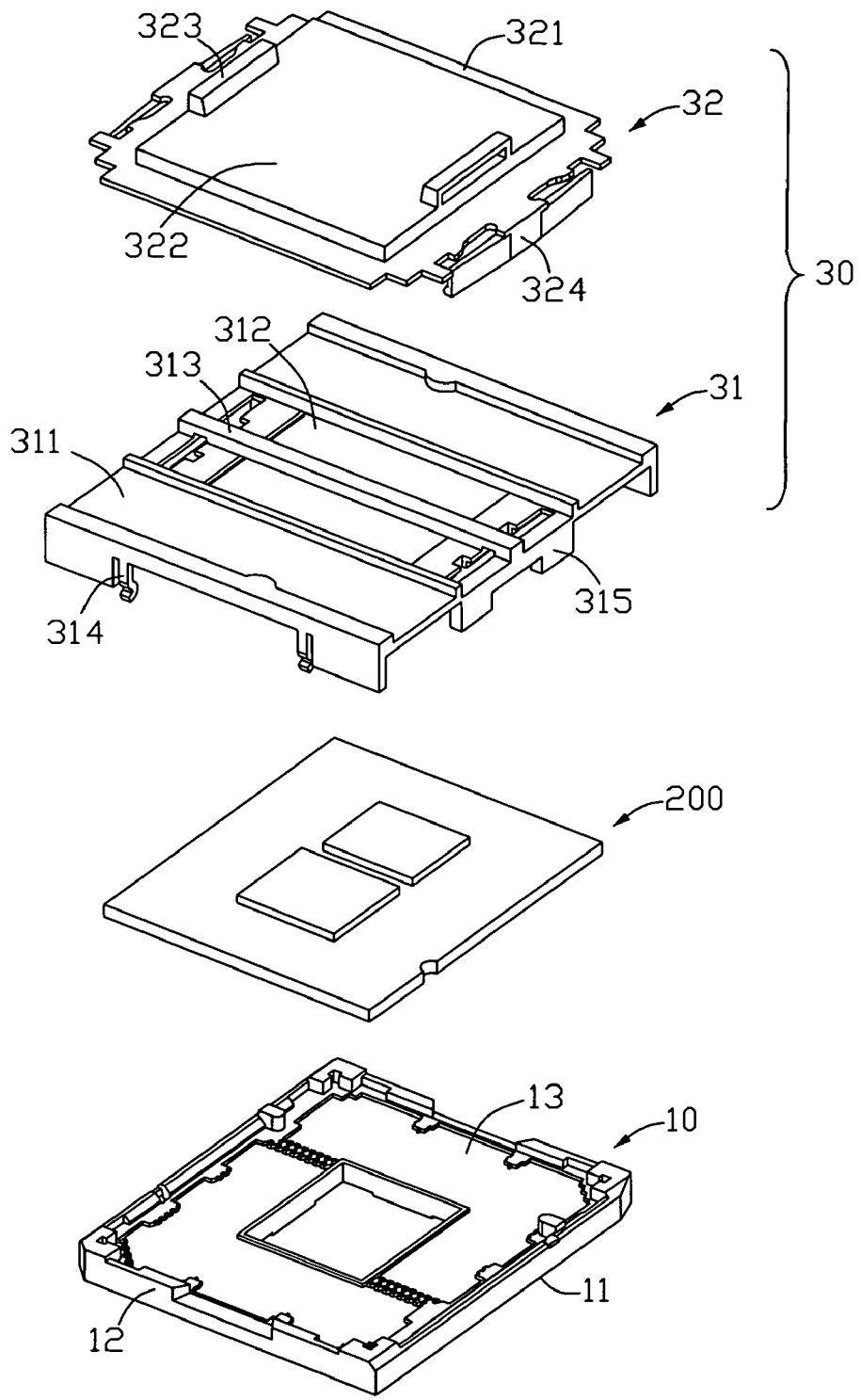
FIG. 2 is an exploded perspective view of the CPU socket assembly shown in FIG. 1.
Figure 3:
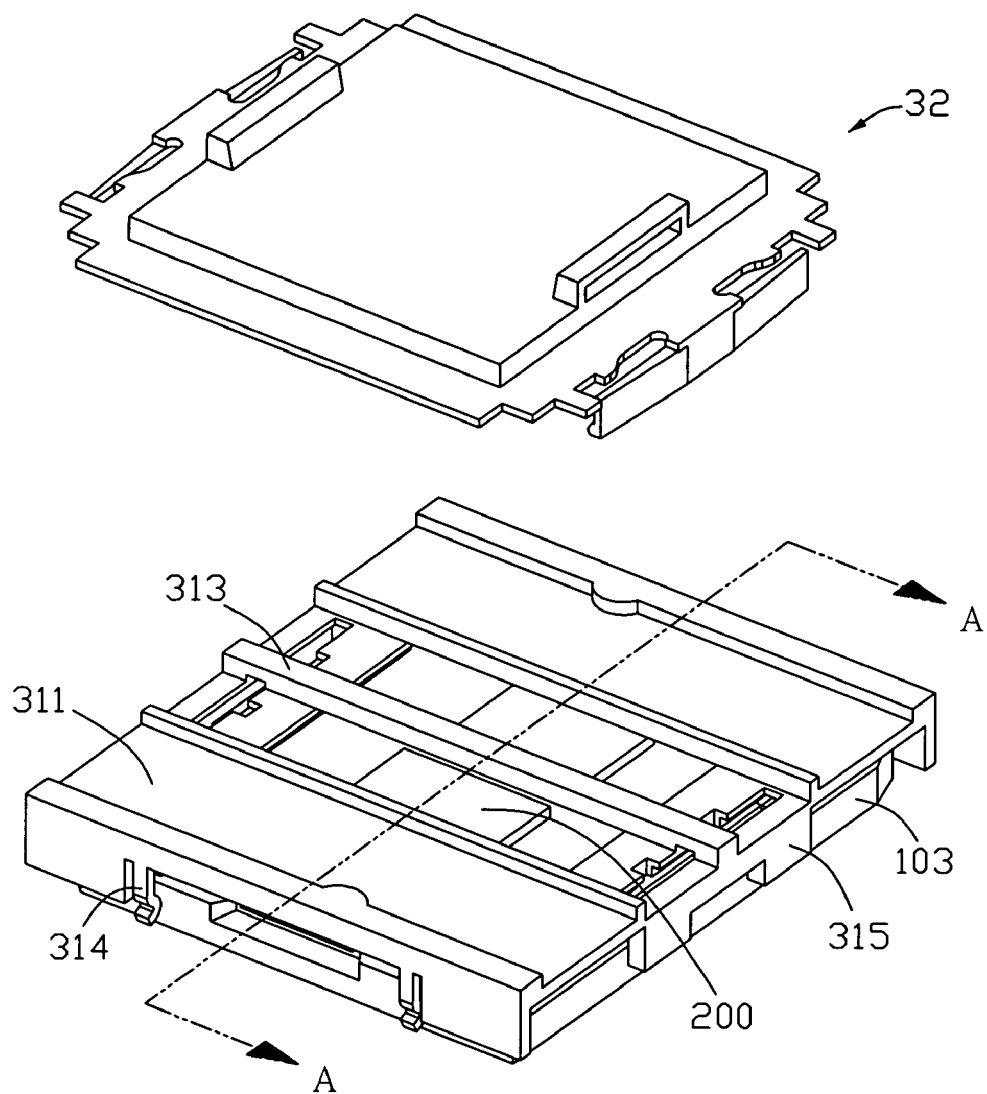
FIG. 3 is a partial perspective view of the CPU socket assembly shown in FIG. 1, showing the pick up cap taken from the CPU socket.
Figure 4:
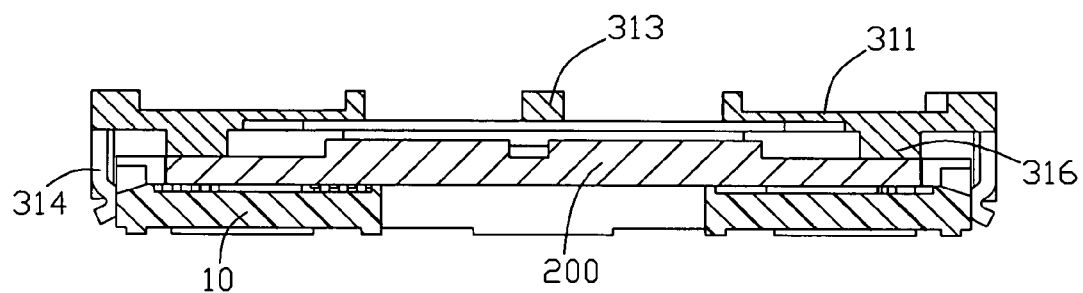
FIG. 4 is sectional view taken from line A-A shown in FIG. 3.
Figure 5:
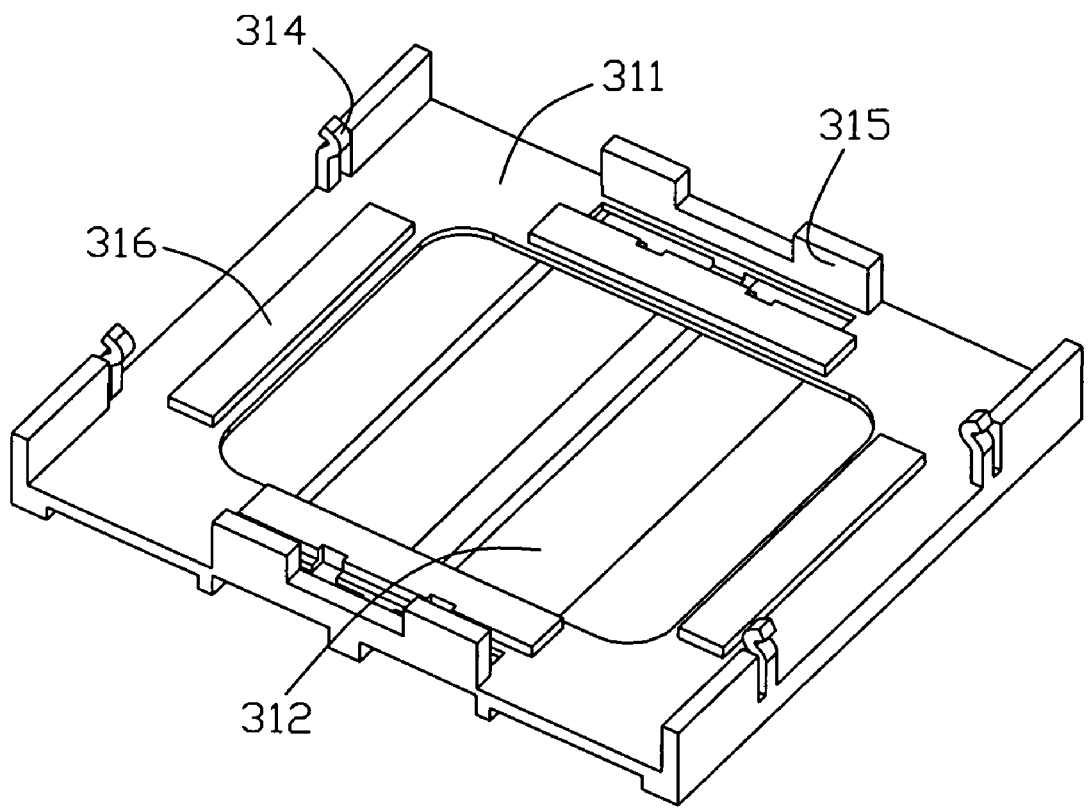
FIG. 5 is a perspective view of the retention piece shown in FIG. 1.

Please referring to FIG. 2 and FIG. 5, the retention piece 31 is attached to the insulative housing 10 and the pick up cap 32 is secured to the retention piece 31. In a preferred embodiment of the present invention, the retention piece is made of metal material such as aluminum or the like. The retention piece 31 comprises a top wall 311 and a plurality of sidewalls 315 extending downwardly from the top wall 311.

The top wall 311 includes a plurality of supporting sections 313 extending upwardly therefrom and a pair of press sections 316 protruding downwardly therefrom. The press section 316 covers part of the receiving space 13 so that it can press the package 200 when the package is located in the receiving space 13. The top wall 311 defines a plurality of recesses 312 for heat dissipating. A plurality of latches 314 are arranged on the sidewalls 315 for clasping the sidewall 12 of the insulative housing 10.

Please referring to FIG. 2, the pick up cap 32 is made of plastic material and comprises a base 321, a sucking section 322 protruded from the base 321 with a smooth top surface, a pair of pick up section 323 located at opposite sides of the sucking section 322, and two latches 324 extending downwardly from the base 321. Although the pick up cap 32 and the retention piece 31 are made of different materials in the preferred embodiment, they can also be made of the same material.

In assembly, the pick up device 30 is detached from the insulative housing 10 so that the package 200 is put into the receiving space 13. Then, the retention piece 31 and the pick up cap 32 are secured to the insulative housing 10 and the press sections 316 contact with the package 200. Then, the CPU socket assembly 100 can be sucked by the vacuum pick up equipment and transmits to the printed circuit board. Afterwards, the pick up cap 32 is taken down before soldering to the printed circuit board and the retention piece 31 remains on the insulative housing 10. The supporting sections 313' are located upon the package 200 thereby avoiding pressure apply to the package 200.

The package 200 is positioned in the receiving space 13 by the retention piece 31 for avoiding the package 200 moving on the insulative housing 10. After soldering, the press sections 316 of the retention piece 32 still press the package 200 which makes the connection between the electrical contacts and the package 200 more reliable. Furthermore, since the retention piece 31 is made of metal and secured on the insulative housing 10 during soldering, the distortion of the insulative housing 10 is also limited.

Figure 6:
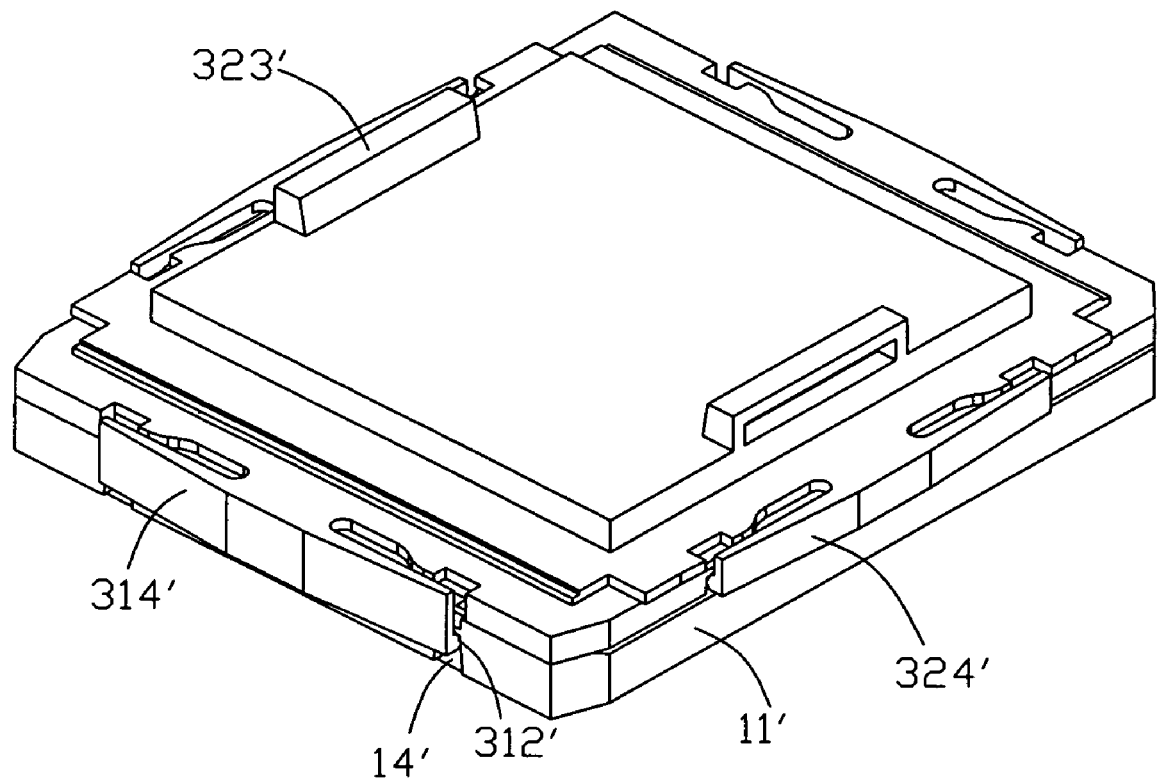
FIG. 6 is an assembly view of a CPU socket assembly in accordance with a second embodiment of the present invention.
Figure 7:
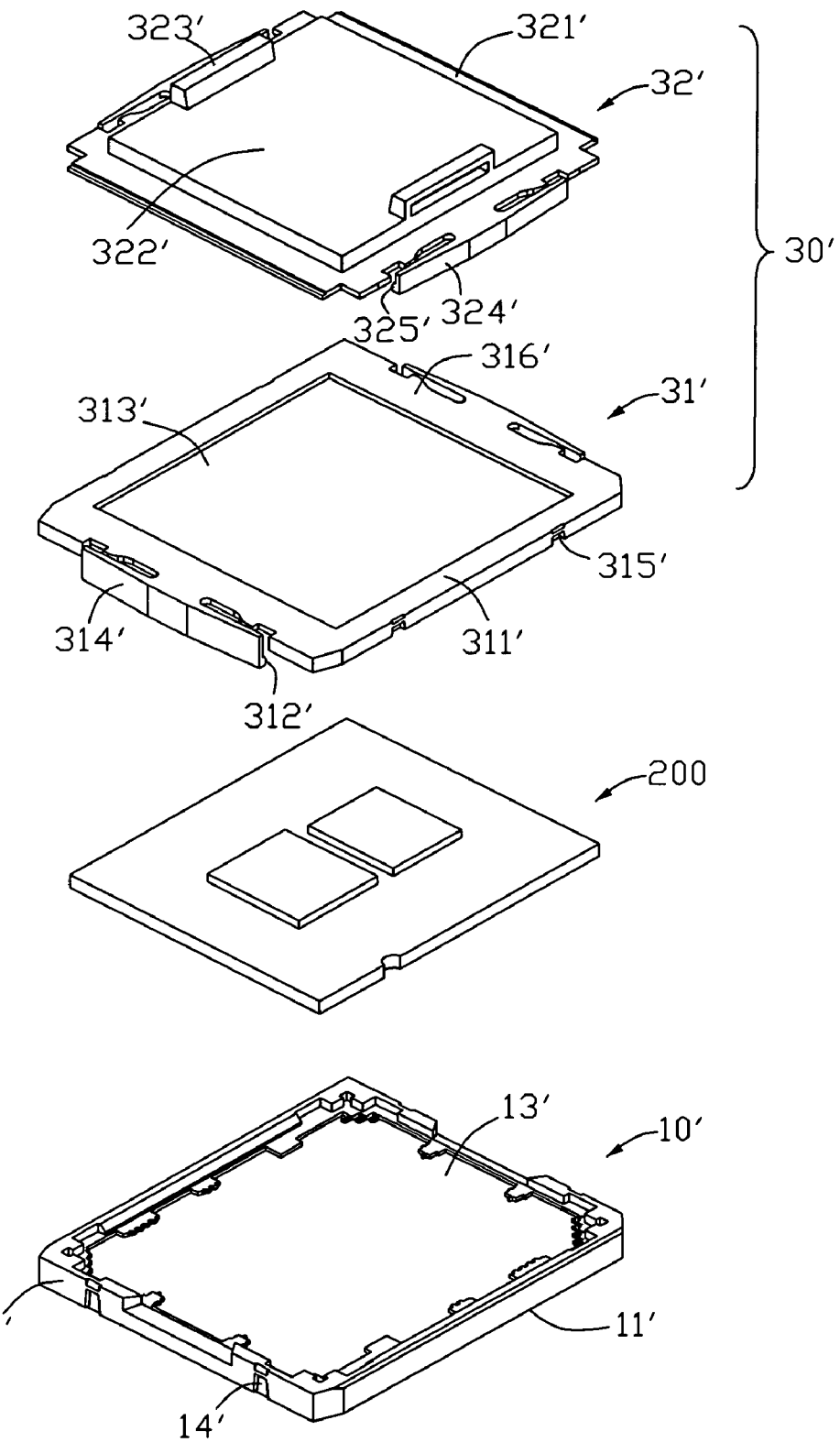
FIG. 7 is an exploded perspective view of the CPU socket assembly shown in FIG. 6.
Figure 8:
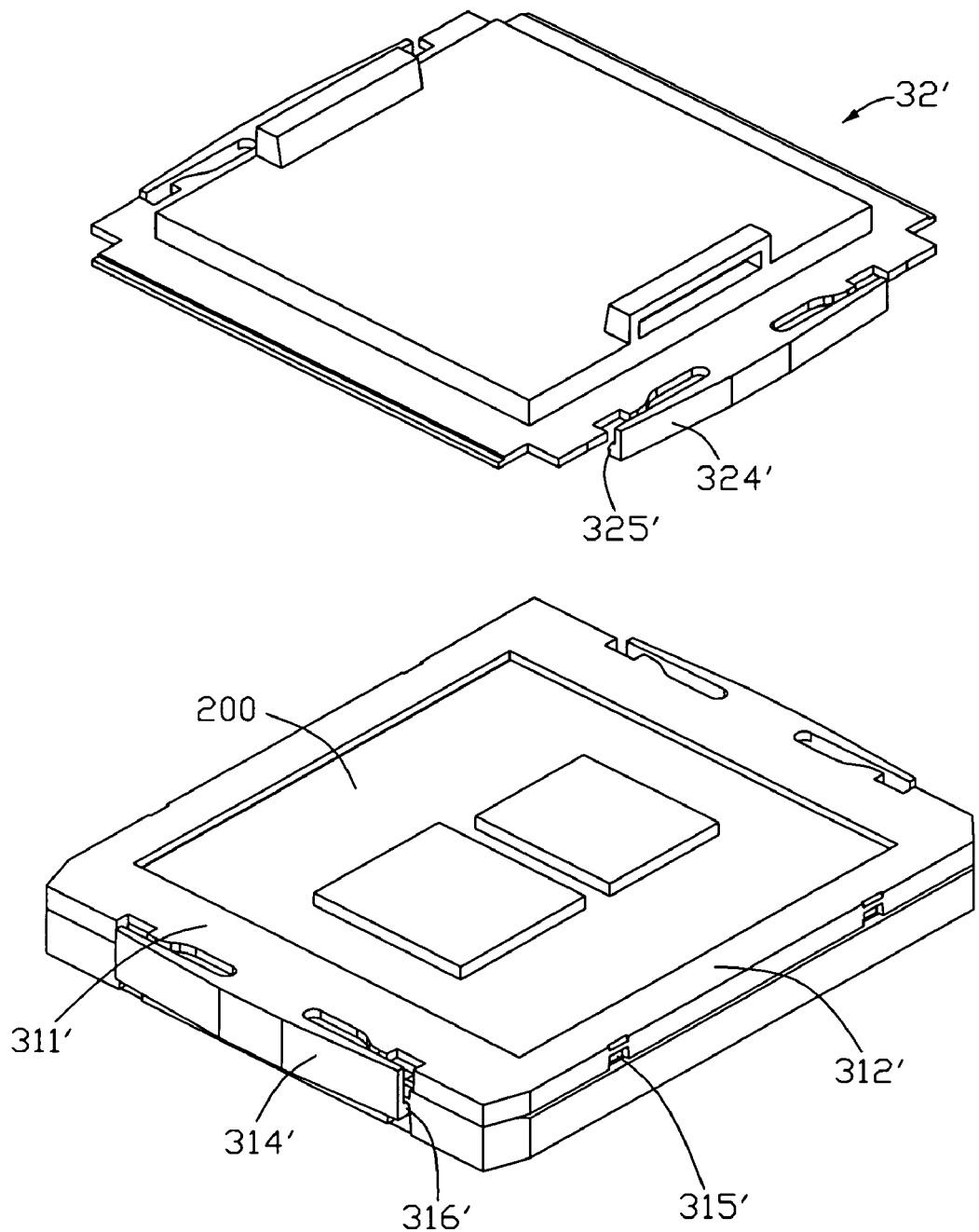
FIG. 8 is a partial perspective view of the CPU socket assembly shown in FIG. 6, showing the pick up cap taken from the CPU socket.
Figure 9:
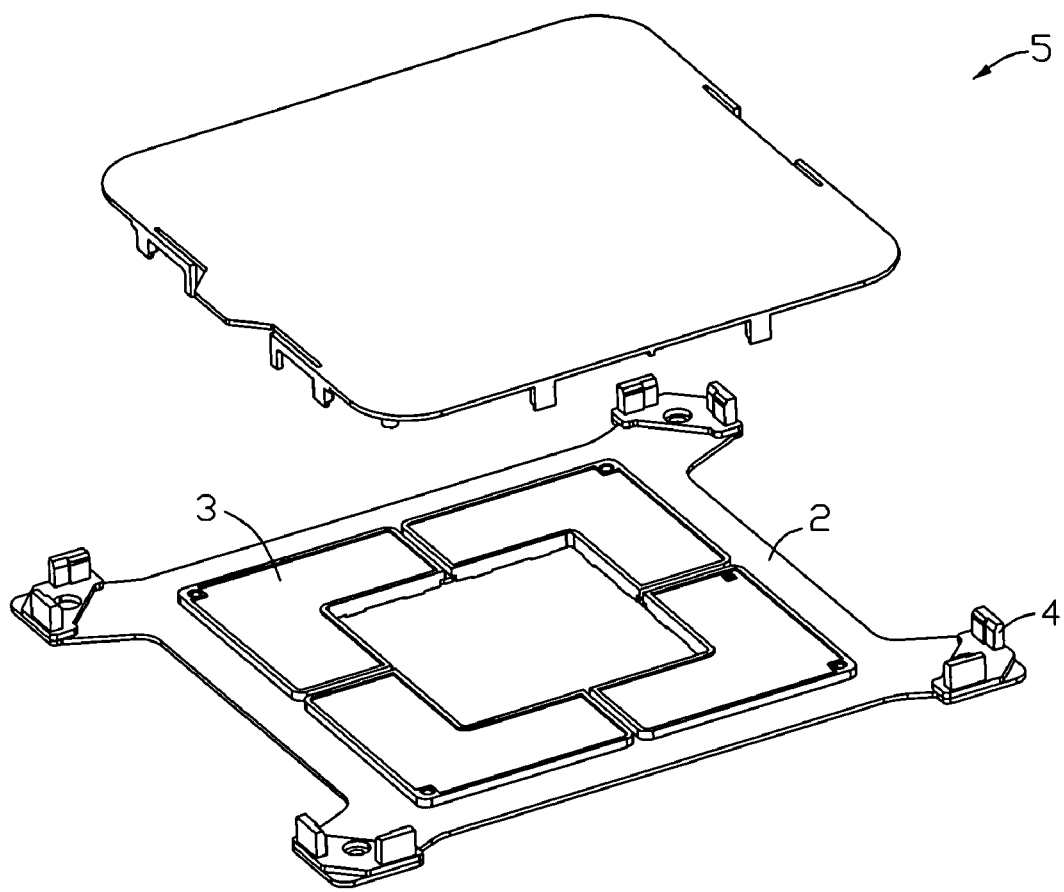
FIG. 9 is an exploded view of a conventional CPU socket assembly.
Figure 10:
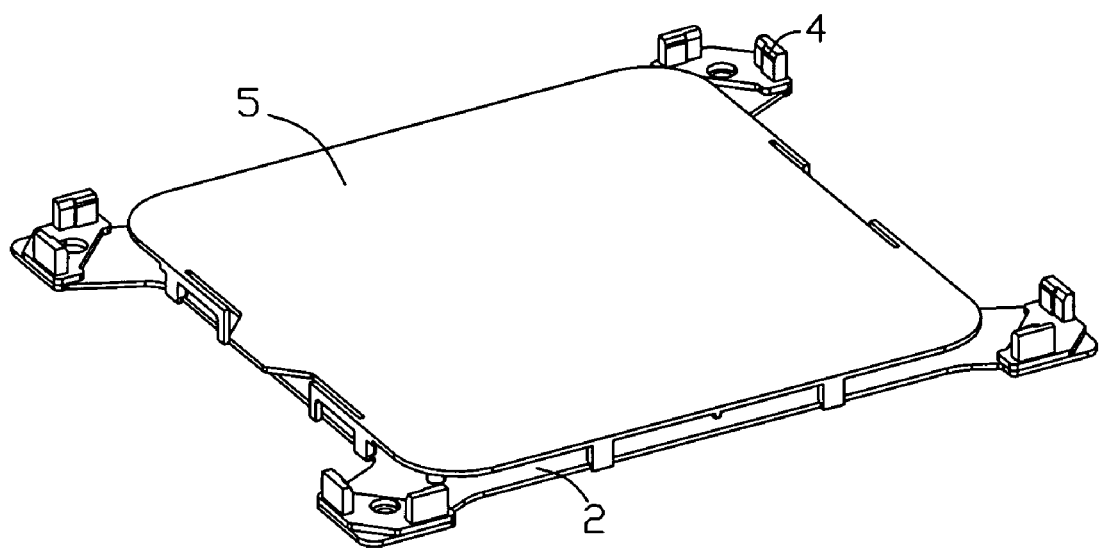
FIG. 10 is an assembly view of the CPU socket assembly shown in FIG. 9.

FIGS. 6 to 8 show another CPU socket assembly 100' according to a second embodiment of the present invention which comprises a CPU socket (not labeled) and a pick up cap device 30' mounted thereon. The CPU socket includes an insulative housing 10' and a plurality of electrical contacts (not shown) secured thereon. The pick up device 30' is a two-piece structure and includes a retention piece 31' and a pick up cap 32' sucked by a vacuum pick up equipment (not shown).

The insulatve housing 10' and the pick up cap 32' are similar to the first embodiment. The insulative housing 10' is made of plastic material and comprises a base 11' and a plurality of sidewalls 12' extending upwardly therefrom. The side walls 12' define a receiving space 13' for the package 200. The base 11' has a plurality of passages (not shown) extending therethrough for receiving the contacts therein.

Please referring to FIG. 7, the pick up cap 32' is made of plastic material and comprises a base 321', a sucking section 322' protruded from the base 321' with a smooth top surface, a pair of pick up sections 323' located at opposite sides of the sucking section 322', and a pair of latches 324' extending downwardly from the base 321'.

Please referring to FIG. 7 and FIG. 8, the retention piece 31' is attached to the insulative housing 10' and the pick up cap 32' is secured to the retention piece 31'. The retention piece 31' is made of plastic material and comprises a top wall 311' and a pair of latches 314' extending downwardly from the top wall 311'. The latch 314' is provided with a protrusion 312' for clasping slot 14' of the insulative housing 10'. A plurality of slots 315' are defined on side face of the top wall 311' for mating with corresponding protrusions 325' on the latch 324'.

The top wall 311 defines an opening 313' and includes a pair of press sections 316' at opposite edges of the opening 313'. The press section 316' covers part of the receiving space 13 so that it can press the package 200 when the package is located in the receiving space 13'. The opening 313' is substantially equal to the package 200 so that most of the package 200 is exposed to a top face of the retention piece 31' and takes a downward pressure.

In assembly, the pick up device 30' is detached from the insulative housing 10' so that the package 200 can be put into the receiving space 13'. Then, the retention piece 31' and the pick up cap 32' are lid to the insulative housing 10' and the press sections 316' contacts with the package 200. Then, the CPU socket assembly 100' can be sucked by the vacuum pick up equipment and transmits to the printed circuit board. Afterwards, the pick up cap 32' is taken down before soldering to the printed circuit board and the retention piece 31' remains on the insulative housing 10'.

The package 200 is position in the receiving space 13' by the retention piece 31' thereby avoiding the package 200 moving on the insulative housing 10'. Furthermore, after soldering, the press sections 316' of the retention piece 31' still press the package 200 which makes the connection between the electrical contacts and the package 200 more reliable. Furthermore, since the retention piece 31' is made of metal and secured on the insulative housing 10' during soldering, the distortion of the insulative housing 10 is also limited.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

We claim:

1. A CPU socket assembly comprising:
   a CPU socket including:
      an insulative housing having a receiving space;
      a plurality of electrical contacts secured to the insulative housing and having contact portions disposed in the receiving space; and
      a retention piece attached to the insulative housing, the retention piece comprising a pressing section covering part of the receiving space; and
   a pick up cap mounted to the CPU socket and having a top planar surface.

2. The CPU socket assembly as claimed in claim 1, wherein the insulative housing includes a base and a plurality of sidewalls extending upwardly from the base, and the receiving space is formed by the sidewalls.

3. The CPU socket assembly as claimed in claim 1, wherein the retention piece includes a top wall and a latch extending downwardly from the top wall, and the pressing section is formed on the top wall.

4. The CPU socket assembly as claimed in claim 3, wherein the pick up cap comprises a plurality of latches mounted to the retention piece.

5. The CPU socket assembly as claimed in claim 4, wherein the latches of the retention piece and the latches of the pick up cap are located on different sides.

6. The CPU socket assembly as claimed in claim 1, further comprising a package received in the receiving space, and wherein the pressing section contacts with the package.

7. The CPU socket assembly as claimed in claim 6, wherein the top wall of the retention piece comprises a supporting section located upon the package for preventing a load from applying to the package.

8. The CPU socket assembly as claimed in claim 6, wherein the top wall of the retention piece defines a recess so that the package is exposed to a top face of the retention piece and takes a downward pressure.

9. The CPU socket assembly as claimed in claim 1, wherein the retention piece is made of metal material.

10. A CPU socket assembly comprising:
    an insulative housing defining a base with an upward receiving cavity thereabove;

a plurality of contacts disposed in the base with contacting sections upwardly extending into the receiving cavity; and a securing device detachably assembled upon the housing and covering said receiving cavity; wherein said securing device is characterized to be strong enough to hold the housing during soldering the contacts to a printed circuit board, and dimensioned to be high enough to hold a CPU in the receiving cavity during use.

11. The CPU socket assembly as claimed in claim 10, wherein said securing device defines at least a window at a top wall so as to allow heat dissipation while preventing suction usage during mounting the housing to the printed circuit board.

12. The CPU socket assembly as claimed in claim 11, further including pick up cap attached upon the securing device for suction during mounting the housing to the printed circuit board.

13. The CPU socket assembly as claimed in claim 12, wherein said securing device is metal while said pick up cap is plastic.

* * * * *